(12) United States Patent
Park et al.

(10) Patent No.: US 10,990,792 B2
(45) Date of Patent: Apr. 27, 2021

(54) ELECTRONIC DEVICE INCLUDING BIOMETRIC SENSOR

(71) Applicant: SAMSUNG ELECTRONICS CO., LTD., Suwon-si (KR)

(72) Inventors: Jihoon Park, Suwon-si (KR); Jihun Heo, Suwon-si (KR); Sanggeun Han, Suwon-si (KR); Hyunwoo Kim, Suwon-si (KR); Bongjae Rhee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/273,476

(22) Filed: Feb. 12, 2019

(65) Prior Publication Data

US 2019/0251325 A1 Aug. 15, 2019

(30) Foreign Application Priority Data

Feb. 14, 2018 (KR) ........................ 10-2018-0018607

(51) Int. Cl.
  *G06K 9/00* (2006.01)
  *H05K 1/02* (2006.01)
  *H05K 1/11* (2006.01)
  *G06F 3/041* (2006.01)

(52) U.S. Cl.
  CPC ......... *G06K 9/0004* (2013.01); *G06F 3/0412* (2013.01); *G06K 9/00053* (2013.01); *H05K 1/028* (2013.01); *H05K 1/118* (2013.01)

(58) Field of Classification Search
  CPC .. G06K 9/0004; G06K 9/00053; G06K 9/741; G06K 9/0002; G06F 3/0412; H05K 1/118; H05K 1/028
  See application file for complete search history.

(56) References Cited

U.S. PATENT DOCUMENTS

| | | | |
|---|---|---|---|
| 8,902,356 B2 | 12/2014 | Seo et al. | |
| 9,697,409 B2 | 7/2017 | Myers | |
| 10,366,272 B2 | 7/2019 | Song et al. | |
| 10,410,033 B2 | 9/2019 | He et al. | |
| 10,452,937 B2 | 10/2019 | Jin et al. | |
| 2011/0267535 A1 | 11/2011 | Seo et al. | |
| 2013/0181310 A1 | 7/2013 | Jun | |
| 2014/0138788 A1 | 5/2014 | Kim et al. | |
| 2014/0354596 A1* | 12/2014 | Djordjev | G06K 9/0002 345/175 |

(Continued)

FOREIGN PATENT DOCUMENTS

| | | |
|---|---|---|
| KR | 10-1558439 | 10/2015 |
| KR | 2017-0141522 A | 12/2016 |
| KR | 2017-0119623 A | 10/2017 |

OTHER PUBLICATIONS

International Search Report dated Jun. 10, 2019 in counterpart International Patent Application No. PCT/KR2019/001829.

*Primary Examiner* — Premal R Patel
(74) *Attorney, Agent, or Firm* — Nixon & Vanderhye P.C.

(57) ABSTRACT

An electronic device is provided. The electronic device includes a transparent member comprising a transparent material, a display panel disposed under the transparent member and including a plurality of pixels, a biometric sensor disposed under the display panel, and a filter disposed between the display panel and the biometric sensor and covering the biometric sensor.

27 Claims, 11 Drawing Sheets

(56) References Cited

U.S. PATENT DOCUMENTS

| | | |
|---|---|---|
| 2015/0071509 A1 | 3/2015 | Myers |
| 2016/0343634 A1 | 11/2016 | Erhart et al. |
| 2017/0212613 A1 | 7/2017 | Hwang et al. |
| 2017/0270342 A1* | 9/2017 | He .................... G06F 3/042 |
| 2017/0300736 A1 | 10/2017 | Song et al. |
| 2019/0087630 A1* | 3/2019 | Seo .................. G06K 9/0012 |
| 2019/0095671 A1* | 3/2019 | Yeke Yazdandoost ................. G06K 9/2027 |
| 2019/0205596 A1* | 7/2019 | Kim .................. G06K 9/0002 |
| 2019/0205603 A1* | 7/2019 | Lee .................. H01L 27/3272 |

* cited by examiner

ELECTRONIC DEVICE INCLUDING BIOMETRIC SENSOR

CROSS-REFERENCE TO RELATED APPLICATION

This application is based on and claims priority under 35 U.S.C. § 119 to Korean Patent Application No. 10-2018-0018607, filed on Feb. 14, 2018, in the Korean Intellectual Property Office, the disclosure of which is incorporated by reference herein its entirety.

BACKGROUND

1. Field

The present disclosure relates to an apparatus including a biometric sensor for sensing biometric information of a user.

2. Description of Related Art

Recently, technologies of performing user authentication using biometric information (e.g., fingerprints, irises, or the like) of a user, obtained by a biometric sensor, have been developed. Biometric sensors for fingerprint recognition may be classified into an optical type, an ultrasonic type, and a capacitive type, according to a method of obtaining fingerprint information.

It is necessary for an optical sensor to maintain a constant distance between a display and the sensor and to prevent foreign substances (e.g., dust) from being introduced between the display and the sensor. However, due to external impacts or aging in the process of using an electronic device, a distance between the display and the biometric sensor may be changed, or the performance of the sensor may be degraded by foreign substances introduced between the display and the sensor.

The above information is presented as background information only to assist with an understanding of the present disclosure. No determination has been made, and no assertion is made, as to whether any of the above might be applicable as prior art with regard to the present disclosure.

SUMMARY

Embodiments of the present disclosure to address at least the above-mentioned problems and/or disadvantages and provide at least the advantages described below. Accordingly, an aspect of the present disclosure is to provide a biometric sensor having a structure for stably maintaining a distance between a display and a sensor to prevent and/or reduce foreign substances from being introduced between the display and the sensor and an apparatus including the biometric sensor.

In accordance with an aspect of the present disclosure, an electronic device is provided. The electronic device may include a transparent member comprising a transparent material, a display panel disposed under the transparent member and including a plurality of pixels, a biometric sensor disposed under the display panel, and a filter disposed between the display panel and the biometric sensor to cover the biometric sensor.

In accordance with another aspect of the present disclosure, an electronic device is provided. The electronic device may include a display including a panel layer and a supporting layer configured to support the panel layer, a transparent member comprising a transparent material disposed on the panel layer, a biometric sensor module comprising a biometric sensor disposed under the supporting layer, and a processor electrically connected with the panel layer and the biometric sensor module and configured to control the electronic device to obtain biometric information using the biometric sensor module. The biometric sensor module may include a circuit board, a sensor housing having one side disposed under the supporting layer and having an other side disposed on the circuit board, and having one side in which an opening is formed, wherein the biometric sensor is disposed in the sensor housing and on the circuit board, an optical layer disposed on the biometric sensor, and an optical filter disposed in the opening.

According to various embodiments of the present disclosure, the electronic device may stably maintain a distance between a display and a sensor to prevent and/or reduce foreign substances from being introduced between the display and the sensor, thus preventing the performance of the sensor from being degraded.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION

Figure 1:
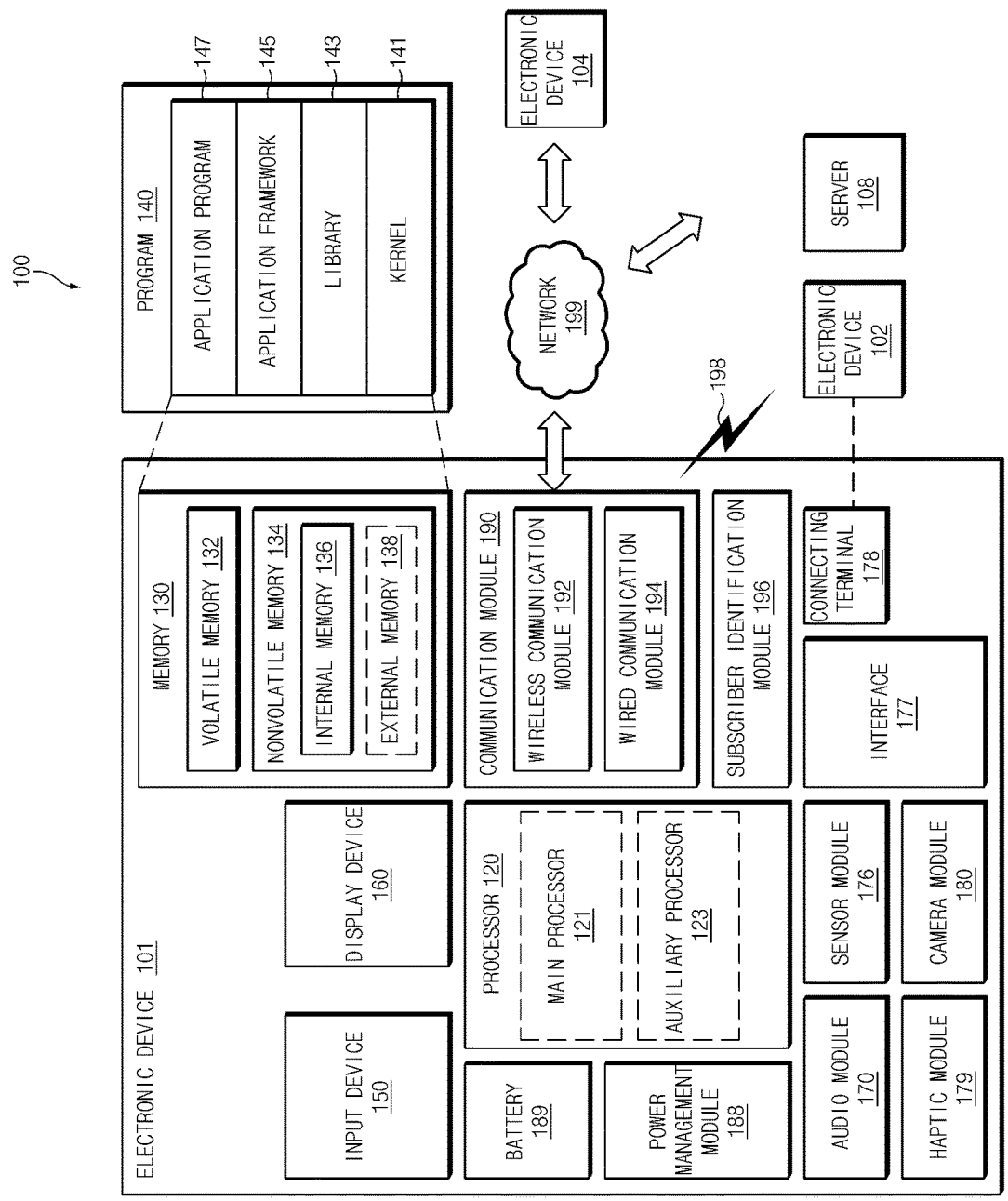
FIG. 1 is a block diagram illustrating an example electronic device in a network environment according to various embodiments.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, or a keyboard.

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector), The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include one or more antennas, and, therefrom, at least one antenna appropriate for a communication scheme used in the communication network, such as the first network 198 or the second network 199, may be selected, for example, by the communication module 190 (e.g., the wireless communication module 192). The signal or the power may then be transmitted or received between the communication module 190 and the external electronic device via the selected at least one antenna.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
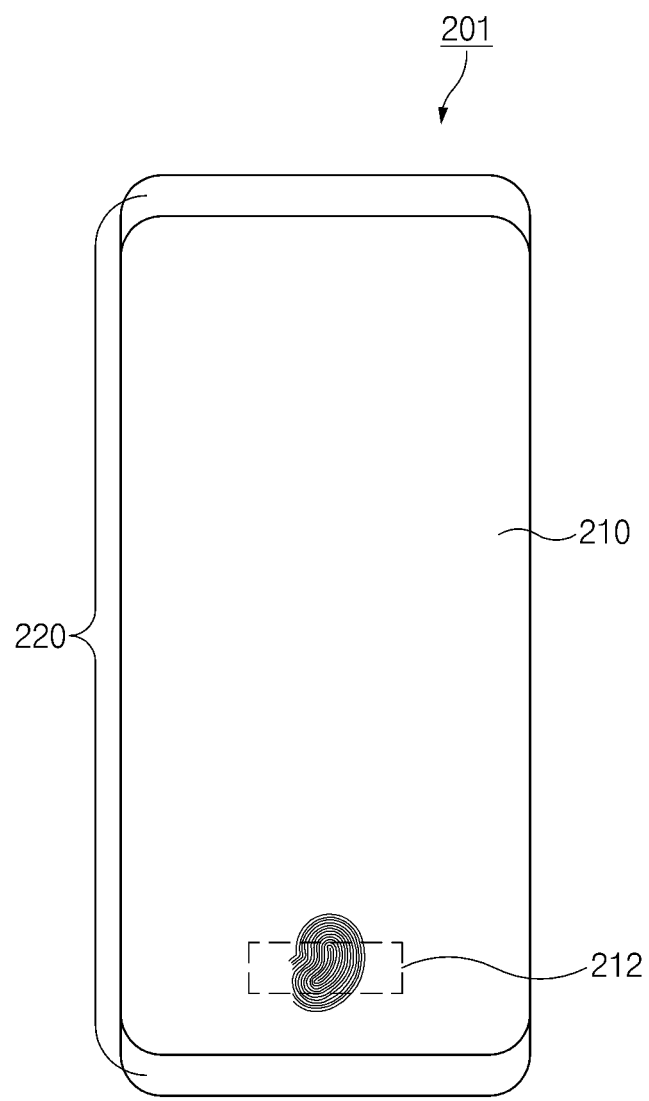
FIG. 2 is a diagram illustrating the appearance of an example electronic device according to an embodiment.

FIG. 2 is a diagram illustrating the appearance of an example electronic device according to an embodiment.

Referring to FIG. 2, according to an embodiment, a display (or display panel) 210 and a housing 220 may be exposed on a front surface of an electronic device 201 (e.g., an electronic device 101 of FIG. 1). According to an embodiment, the electronic device 201 may include various hardware modules which are not shown. For example, a pressure sensor which senses strength (pressure) of a touch input of a user and/or a biometric sensor which detects a fingerprint of the user may be disposed on a rear surface of the display 210.

According to an embodiment, the electronic device 201 may detect the fingerprint of the user through a second area 212 of the display 210. To this end, the biometric sensor for detecting the fingerprint may be disposed on a rear surface of the second area 212 of the display 210.

According to various embodiments of the present disclosure, although the biometric sensor is disposed on the rear surface of the display 210, it may provide a sensor package structure capable of maintaining a proper distance from the display 210 to accurately obtain information about the fingerprint of the user and prevent and/or reduce performance from being degraded due to the introduction of foreign substances outside the biometric sensor.

In FIG. 2, the electronic device 201 is merely illustrative and is not limited to the example described above. For example, a receiver, a camera module, an iris sensor, other biometric sensors, or the like may be disposed on the rear surface of the display 210.

Figure 3:
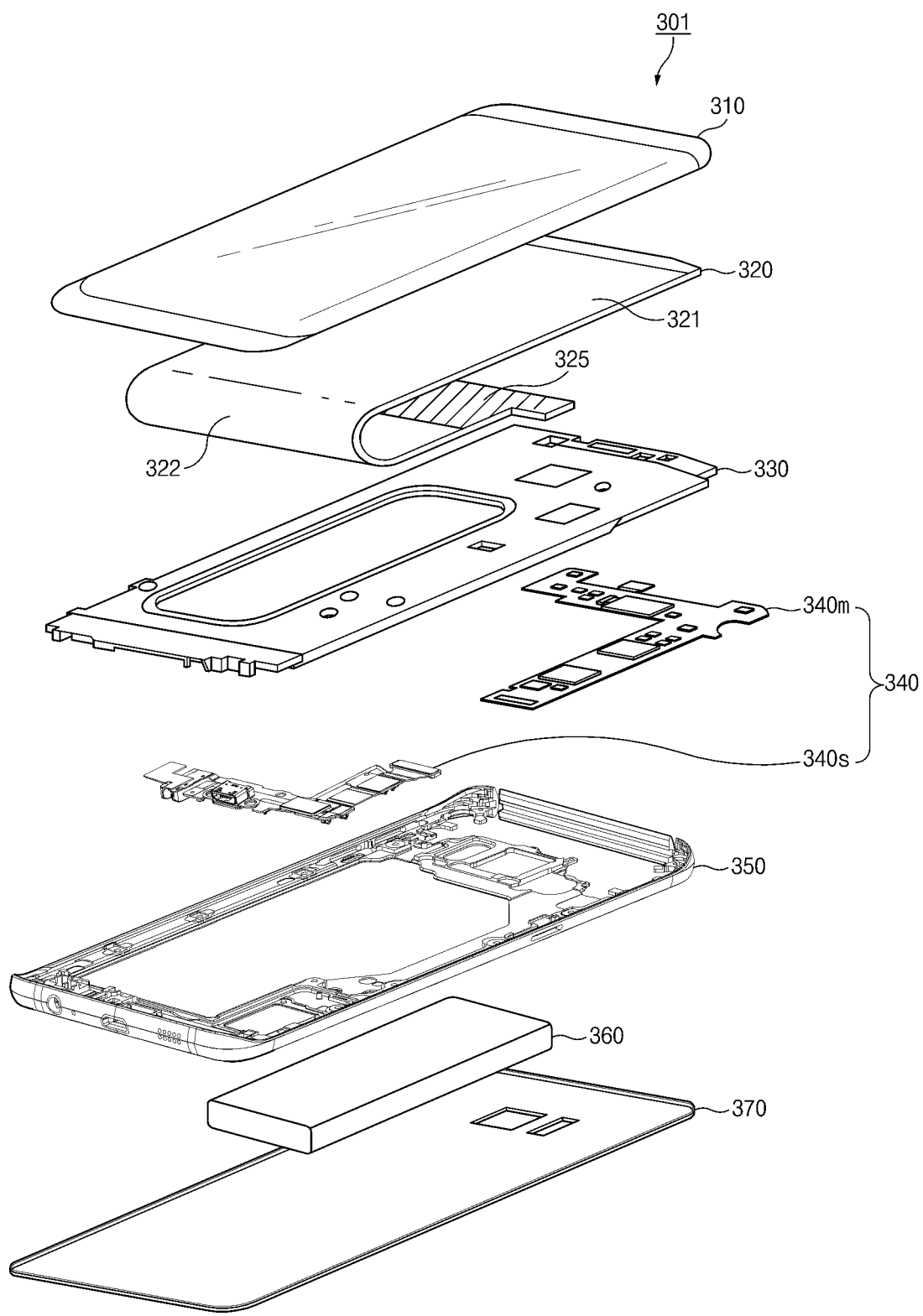
FIG. 3 is an exploded perspective view illustrating an example electronic device according to an embodiment.

FIG. 3 is an exploded perspective view illustrating an example electronic device according to an embodiment.

Referring to FIG. 3, an electronic device 301 (e.g., an electronic device 101 of FIG. 1 or an electronic device 201 of FIG. 2) may include a transparent member 310 (e.g., a cover glass), a display device 320, a supporting member (e.g., a support) 330, a circuit board 340, a side member 350, a battery 360, and/or a back cover 370. According to various embodiments, the electronic device 301 may not include some of the components shown in FIG. 3 and may further include a component which is not shown in FIG. 3.

According to an embodiment, the transparent member 310 (e.g., a first plate comprising a transparent material such as, for example, a cover glass) may transmit light generated by the display device 320. For another example, a user may touch the transparent member 310 with a part (e.g., a finger) of his or her body to provide a touch input (including a touch using an electronic pen) to the electronic device 301. The transparent member 310 may be formed of various transparent materials, such as, for example, and without limitation, tempered glass, reinforced plastic, flexible polymer materials, or the like, to protect the display device 320 and the configuration included in the electronic device 301 from an external impact. According to various embodiments, the transparent member 310 may be referred to as a glass window or cover glass.

According to an embodiment, the display device 320 may be disposed in a space between the transparent member 310 (e.g., the first plate) and the back cover 370 (e.g., a second plate). The display device 320 may be arranged or combined under, for example, the transparent member 310 and may be exposed through at least a part of the transparent member 310. The display device 320 may output content (e.g., a text, an image, a video, an icon, a widget, a symbol, or the like) and/or may receive an input (e.g., a touch input or an electronic pen input) from the user.

According to an embodiment, the display device 320 may, for example, and without limitation, include a display panel, a touch sensor, and/or an electronic pen sensor. The display panel may include, for example, and without limitation, one or more of a liquid crystal display (LCD) panel, a light-emitting diode (LED) display panel, an organic LED (OLED) display panel, a microelectromechanical systems (MEMS) display panel, an electronic paper display panel, or the like. The touch sensor may include, for example, and without limitation, a capacitive touch panel, a resistive touch panel, an infrared touch panel, an ultrasonic touch panel, or the like. The touch panel may be inserted between display panels (an add-on touch panel), may be directly formed on a display panel (an on-cell touch panel), or may be included in a display panel (an in-cell touch panel). The electronic pen sensor (e.g., a digitizer) may detect a touch, a gesture, hovering, or the like from an electronic pen. According to an embodiment, the display device 320 may include a biometric sensor module (e.g., a fingerprint sensor module) for obtaining biometric information (e.g., a fingerprint) of the user.

According to an embodiment, the display device 320 may include a planar area 321 and a bending area 322 extending from one side (e.g., an upper side, a lower side, a left side, or a right side) of the planar area 321. Pixels (e.g., OLEDs or the like) of a display panel, a conductive pattern of a touch sensor, a conductive pattern of an electronic pen sensor, and/or the like may be disposed on the planar area 321. The bending area 322 may be electrically connected with a flexible printed circuit board (FPCB) 325, which may be located on a rear surface of the display device 320, through various conductive patterns (wires).

According to an embodiment, a part of the bending area 322 may be bent toward a rear surface of the planar area 321. According to various embodiments, a wire of the FPCB 325 may pass through a side of the supporting member (support) 330 and may be electrically connected with the circuit board 340 (e.g., a main circuit board 340m) via a specified connector. According to various embodiments, similar to the planar area 321, pixels for displaying a variety of information may be arranged on the bending area 322.

According to an embodiment, the supporting member 330 (e.g., a bracket) may include, for example, and without limitation, a metal material, a polymer material, or the like. The supporting member 330 may be disposed between, for example, the display device 320 and the circuit board 340. The supporting member 330 may be combined with the display device 320 and the circuit board 340 to physically support the display device 320 and the circuit board 340. According to an embodiment, a swelling gap for accommodating expansion of the battery 360 may be formed in the supporting member 330.

According to an embodiment, the circuit board 340 may include, for example, the main circuit board 340m and/or a sub-circuit board 340s. According to an embodiment, the main circuit board 340m and the sub-circuit board 340s may be disposed below the supporting member 330 and may be electrically connected with each other via a specified connector or a specified wire. Each of the circuit boards 340m and 340s may be implemented as, for example, and without limitation, a rigid PCB (RPCB) and/or an FPCB, or the like. According to an embodiment, various electronic components, devices, printed circuits, and the like (e.g., a processor, a memory, a communication module (e.g., a wireless communication circuit), and the like) of the electronic device 301 may be mounted or arranged on the circuit boards 340m and 340s. According to various embodiments, each of the circuit boards 340m and 340s may, for example, be referred to as a main board or a printed board assembly (PBA), or may be simply referred to as a PCB.

According to an embodiment, the side member 350 may be disposed between the circuit board 340 and the back cover 370 and receive components of the electronic device 301. The side member 350 may be combined with, for example, the supporting member 330 and/or the back cover 370 of the electronic device 301. The side member 350 may surround a space between the transparent member 310 (e.g., the first plate) and the back cover 370 (e.g., the second plate).

According to an embodiment, the battery 360 may, for example, convert chemical energy and electrical energy in multiple ways. For example, the battery 360 may convert chemical energy into electrical energy and may supply the electrical energy to the display device 320 and various components or modules mounted on the circuit board 340. For another example, the battery 360 may convert electrical energy supplied from the outside into chemical energy and may store the chemical energy. According to an embodiment, a power management module including circuitry for managing charging and discharging of the battery 360 may be included in the circuit board 340.

According to an embodiment, the back cover 370 (e.g., the second plate) may be combined with a rear surface of the electronic device 301. The back cover 370 may be formed, for example, and without limitation, of tempered glass, a plastic molded part, a metal, and/or the like. According to various embodiments, the back cover 370 may be integrated with the side member 350 and/or may be implemented to be detachable by a user. The side member 350 may be referred to as a rear case, a rear plate, or the like.

Figure 4A:
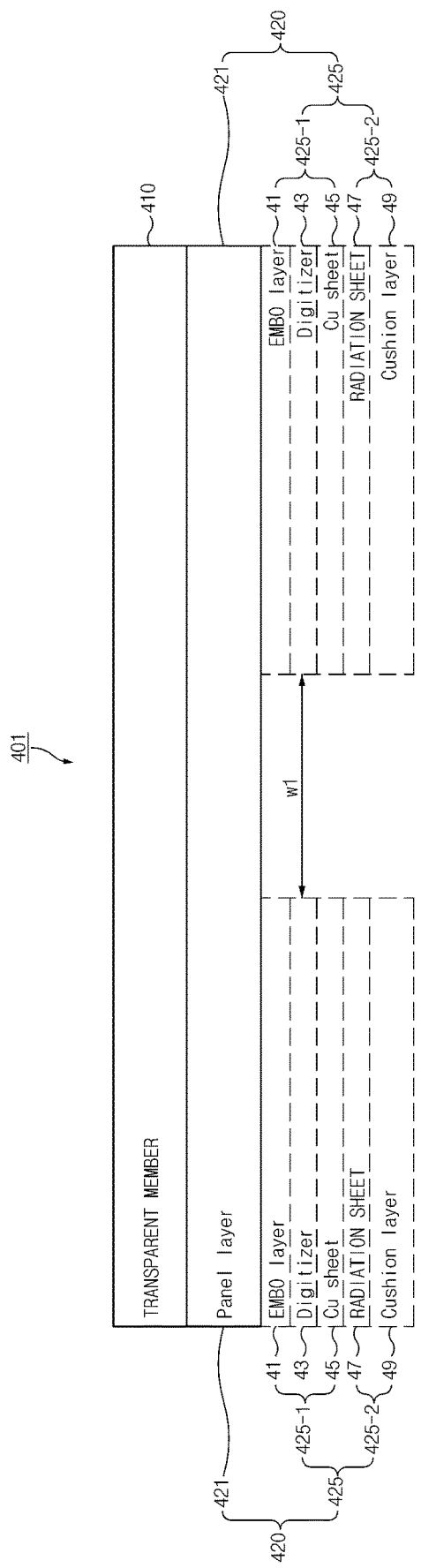
FIGS. 4A and 4B are cross-sectional views illustrating example electronic devices according to various embodiments.

FIG. 4A is a cross-sectional view illustrating an example electronic device according to an embodiment.

The cross-section view illustrated in FIG. 4A corresponds to a cross-sectional view in a state where a biometric sensor module is not attached to a display (or display panel) 420 (e.g., a display device 320 of FIG. 3). Referring to FIG. 4A, an electronic device 401 (e.g., an electronic device 301 of FIG. 3) may include a transparent member 410 (e.g., a transparent member 310 of FIG. 3) and a display 420.

The transparent member 410 may be located on a top layer of the electronic device 401. The display 420 may be located under the transparent layer 410. The display 420 may include a panel layer 421 and a layer structure 425 including a plurality of layers. According to an embodiment, the panel layer 421 may include at least one light emitting device (not shown) and may be disposed under the transparent layer 410. According to an embodiment, the layer structure 425 may be disposed under the panel layer 421. According to an embodiment, the layer structure 425 may include a first layer group 425-1 and a second layer group 425-2. The first layer group 425-1 may include, for example, and without limitation, a supporting layer 41 (e.g., an EMBO layer) on which a pattern is formed, a digitizer (or an electronic pen sensor) 43 for receiving an input from an electronic pen, and a metal layer 45 (e.g., a copper sheet). The supporting layer 41 may absorb an external impact on the panel layer 421 to enhance optical characteristics and may visually hide a pattern included in the digitizer 43. The second layer group 425-2 may include, for example, and without limitation, a radiation sheet 47 for performing a radiation function and a cushion layer 49 for absorbing an external impact. A structure where the first layer group 425-1 and the second layer group 425-2 shown in FIG. 4A are laminated is merely illustrative. The layer structure 425 may not include some of the plurality of layers shown in FIG. 4A or may further include at least one other layer, or at least some of the plurality of layers may vary in location to be disposed. For example, the layer structure 425 may fail to include the digitizer 43 and the metal layer 45. For another example, the layer structure 425 may not include the supporting layer 41 and the radiation sheet 47.

According to an embodiment, the layer structure 425 may include a through area (or an opening). For example, the first layer group 425-1 and the second layer group 425-2 may include a through area having a first width w1.

According to an embodiment, a pressure sensor (not shown) may be disposed under the layer structure 425. According to an embodiment, a circuit board (e.g., an FPCB 325 of FIG. 3) may be disposed below the pressure sensor. For example, as described above with reference to FIG. 3, the circuit board may be extended from one side of the display 420 (e.g., the panel layer 421) to be folded in the direction of a rear surface of the layer structure 425 and may attached to the pressure sensor.

Figure 4B:
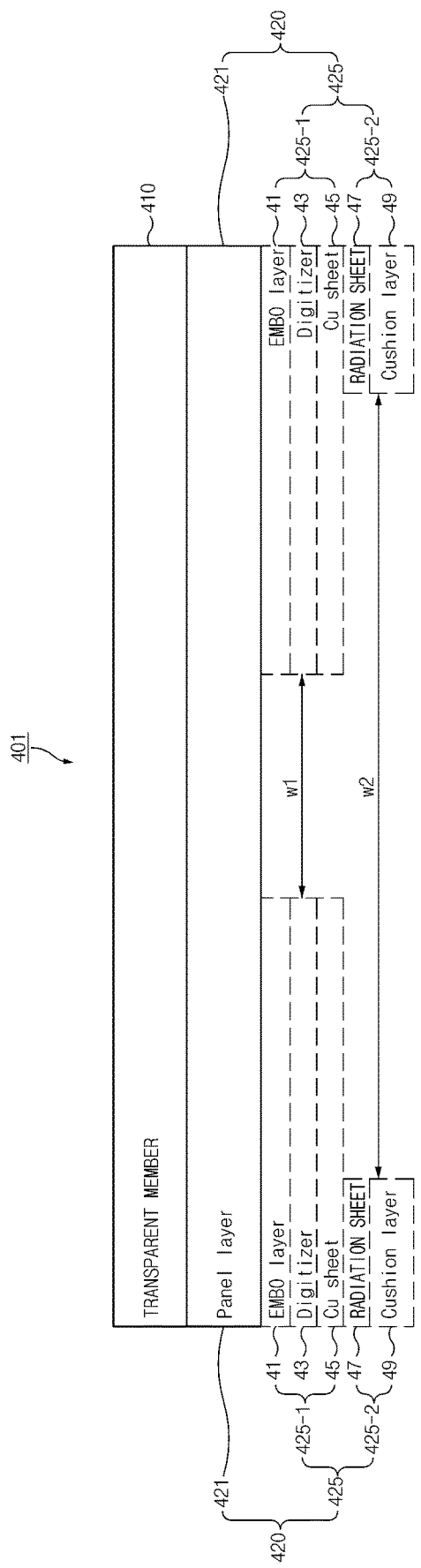

FIG. 4B is a cross-sectional view illustrating an example electronic device according to an embodiment.

The cross-sectional view illustrated in FIG. 4B corresponds to a cross-sectional view in a state where a biometric sensor module is not attached to a display (or display module) 420 (e.g., a display device 310 of FIG. 3). Referring to FIG. 4B, an electronic device 401 (e.g., an electronic device 301 of FIG. 3) may include a transparent member 410 (e.g., a transparent member 310 of FIG. 3) and the display 420.

According to an embodiment, through areas (or openings) respectively formed in a first layer group 425-1 and a second layer group 425-2 may differ in size from each other. For example, a width w2 of the through area of the second layer group 425-2 may be greater than a width w1 of the through area of the first layer group 425-1. Thus, a layer structure 425 may form a stepped structure by the first layer group 425-1 and the second layer group 425-2.

Figure 5A:
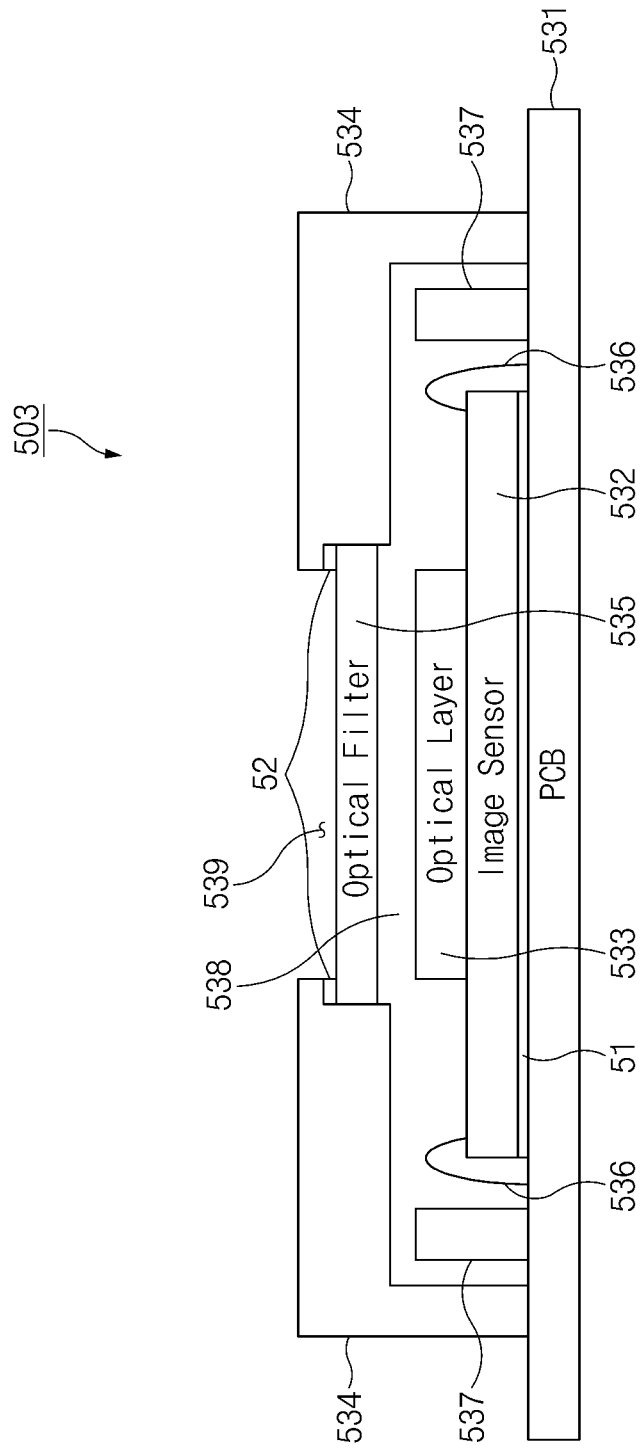
FIGS. 5A, 5B and 5C are sectional views illustrating example package structures of biometric sensor modules according to various embodiments.
Figure 5B:
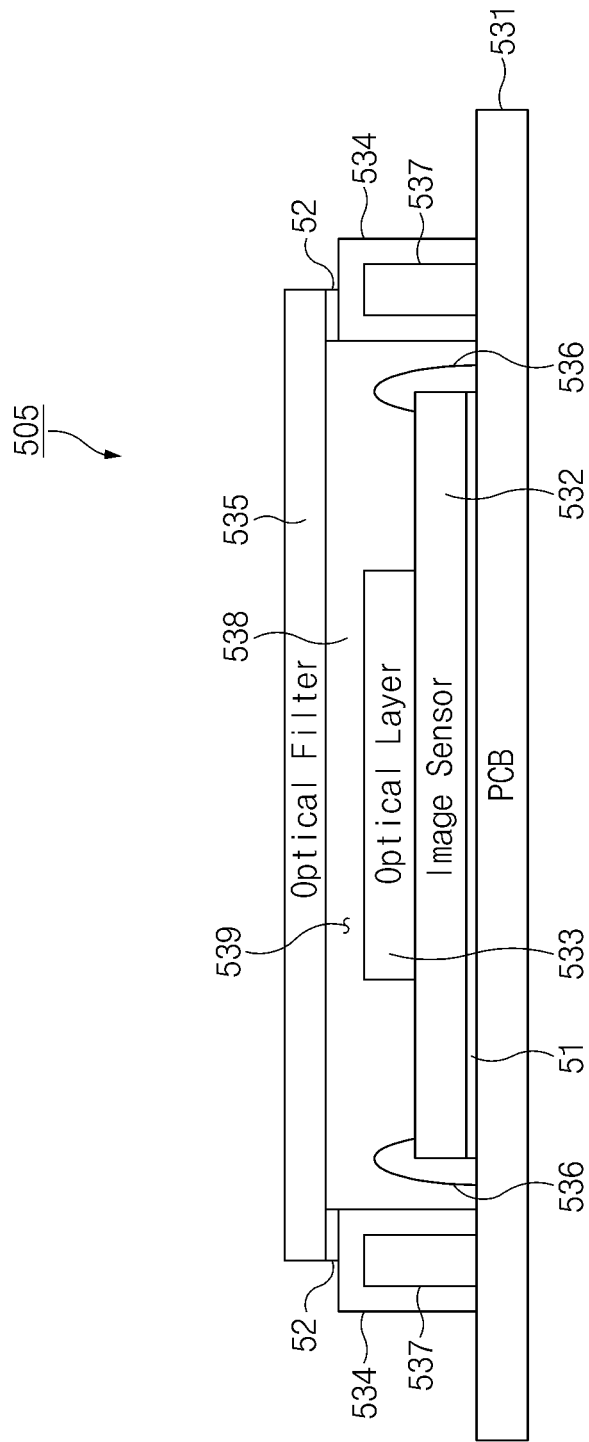
Figure 5C:
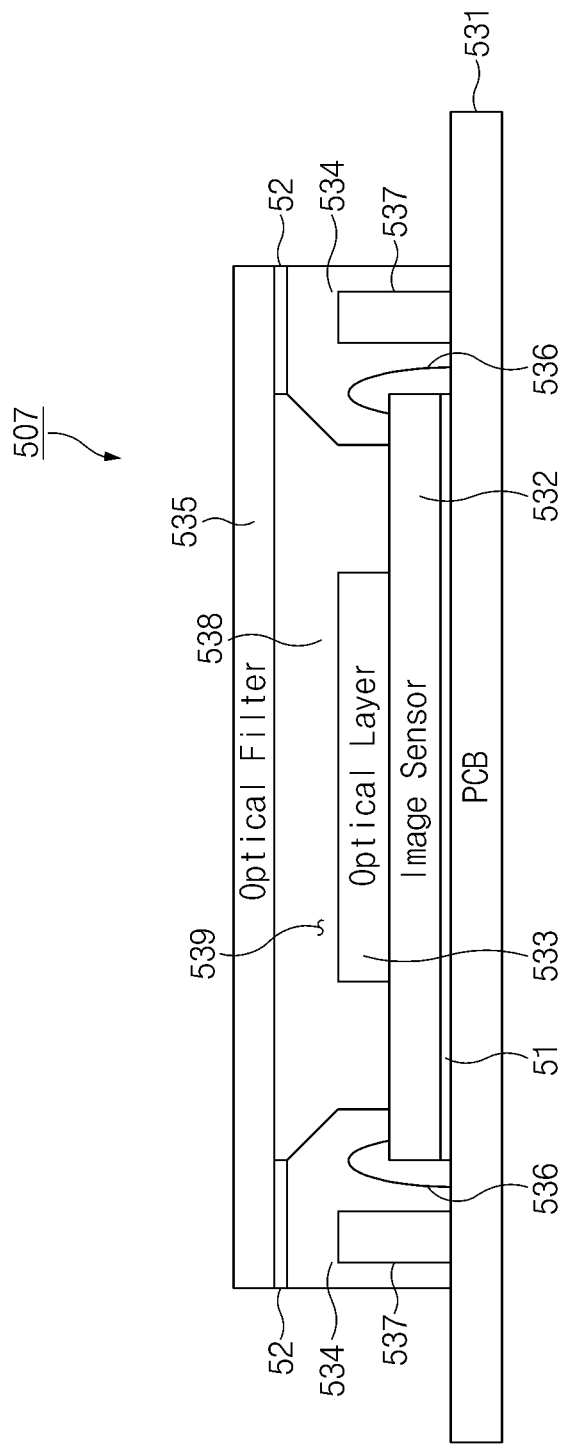

FIGS. 5A, 5B and 5C are sectional views illustrating example package structures of biometric sensor modules according to various embodiments.

FIGS. 5A, 5B and 5C illustrate examples of cross-section views of biometric sensor modules.

Referring to FIG. 5A, a biometric sensor module 503 may include a circuit board 531 (e.g., a PCB), a biometric sensor 532 (e.g., an image sensor), an optical layer 533, a housing 534, an optical filter 535, a conductive wire 536, and a circuit element 537.

According to an embodiment, the circuit board 531 may include an RPCB and an FPCB. The RPCB may include a passive element, a printed circuit, and a sensor integrated circuit (IC) for controlling a biometric sensor. The passive element, the printed circuit, and the sensor IC may be arranged on a rear surface of the RPCB. The FPCB may be extended from one side of the RPCB or may be attached to the rear surface of the RPCB to be electrically connected with the RPCB. The FPCB (or a connection part) may be electrically connected with another circuit board (e.g., an FPCB 325 or a circuit board 340 of FIG. 3) in a state where it is attached to a display (e.g., a display 420 of FIG. 4A).

According to an embodiment, the biometric sensor 532 (e.g., a complementary metal oxide semiconductor (CMOS) image sensor) may be disposed on the circuit board 531. For example, the biometric sensor 532 may be attached to the circuit board 531 by a first adhesive film 51 (e.g., a die attach film (DAF)). The biometric sensor 532 may be, for example, an array-type image sensor on which a plurality of image sensors are arranged at a specified interval. The biometric sensor 532 may, for example, and without limitation, obtain fingerprint information (or a fingerprint image) using a reflected light reflected from a finger of a user.

According to an embodiment, the optical layer 533 may be disposed on the biometric sensor 532. The optical layer 533 may enhance optical characteristics of a reflected light reflected from, for example, an external object (e.g., a finger) and may refract the reflected light to enhance light reception efficiency of the biometric sensor 532. According to an embodiment, the optical layer 533 may include a micro lens of a form which is convex in an upward direction in units corresponding to each of pixels of an image sensor.

According to an embodiment, the housing 534 may be disposed on the circuit board 531. For example, the housing 534 may be attached to the circuit board 531 on the circuit board 531 by the first adhesive film 51 (e.g., the DAF). The housing 534 may include, for example, a polymer material, such as, for example, and without limitation, an epoxy resin, and/or a metal material, such as stainless or aluminum. According to an embodiment, the housing 534 may include an opening 539.

According to an embodiment, the optical filter 535 may be attached to at least a part of one surface of the housing 534 to block the biometric sensor 532 from the outside. For example, the optical filter 535 may be attached to a bottom surface of the housing 534 by a second adhesive film 52 (e.g., a DAF) to cover the opening 539 of the housing 534.

According to an embodiment, the optical filter 535 may, for example, be formed as an optical filter layer of a layer shape, which is disposed in the opening 539 of the housing 534.

According to an embodiment, the optical filter 535 may be spaced apart from the optical layer 533 by a specified distance. Thus, the biometric sensor module 503 may include a dielectric material layer 538 with which a dielectric material (e.g., air) is filled between the optical layer 533 and the optical filter 535. The optical layer 533 may refract a reflected light which is incident through the optical filter 535 based, for example, on a difference in permittivity between the optical layer 533 and the dielectric layer 538. The optical filter 535 may transmit a light (e.g., a visible light) of a specific wavelength and may block a light (e.g., an infrared light) of another wavelength in a reflected light reflected from, for example, the external object (e.g., the finger). For example, the optical filter 535 may transmit a light (e.g., a green light) of a wavelength necessary for the biometric sensor 532 to obtain fingerprint information or a wavelength capable of well passing through a hole formed between light emitting devices of a panel layer (e.g., a panel layer 421 of FIG. 4A) of a display. According to an embodiment, the optical filter 535 may include, for example, and without limitation, a polyethylene terephthalate (PET) film.

According to an embodiment, the conductive wire 536 may electrically connect the circuit board 531 with the biometric sensor 532. The conductive wire 536 may include, for example, a plurality of wires which connect the circuit board 531 with the biometric sensor 532. Fingerprint information obtained by the biometric sensor 532 may be delivered to a sensor IC disposed on the circuit board 531 through the conductive wire 536.

According to an embodiment, the circuit element 537 may be disposed on the circuit board 531. The circuit element 537 may include, for example, and without limitation, various elements (e.g., a capacitor, an electrically erasable programmable read-only memory (EEPROM), and the like), ICs, or the like, necessary for the biometric sensor module 503 to obtain, process, and deliver biometric information. According to an embodiment, the circuit element 537 may be disposed below the circuit board 531.

According to various embodiments, the biometric sensor module 503 may not include some of the components shown in FIG. 5A and may further include a component which is not shown in FIG. 5A. For example, when the circuit board 531 and the biometric sensor 532 are directly connected with each other, the biometric sensor module 503 may not include the conductive wire 536.

Referring to FIG. 5B, a biometric sensor module 505 may include a circuit board 531 (e.g., a PCB), a biometric sensor 532 (e.g., an image sensor), an optical layer 533, a housing 534, an optical filter 535, a conductive wire 536, and a circuit element 537.

According to an embodiment, the housing 534 may be disposed on the circuit board 531. For example, the housing 534 may be attached to the circuit board 531 on the circuit board 531 by a first adhesive film 51 (e.g., a DAF). According to an embodiment, the housing 534 may be disposed to cover the circuit element 537 to fix the circuit element 537 and protect the circuit element 537 from the outside. The circuit element 537 may be blocked from the outside by the housing 534.

According to an embodiment, the optical filter 535 may be attached to at least a part of one surface of the housing 534 to block the biometric sensor 532 from the outside. For example, the optical filter 535 may be attached to a part of a top surface of the housing 534 by a second adhesive film 52 (e.g., a DAF) to cover an opening 539 of the housing 534.

Referring to FIG. 5C, a biometric sensor module 507 may include a circuit board 531 (e.g., a PCB), a biometric sensor 532 (e.g., an image sensor), an optical layer 533, a housing 534, an optical filter 535, a conductive wire 536, and a circuit element 537.

According to an embodiment, the housing 534 may be disposed on the circuit board 531 and the biometric sensor 532. For example, the housing 534 may, for example, be formed on the circuit board 531 and the biometric sensor 532 by injection molding. According to an embodiment, the housing 534 may be disposed to cover the conductive wire 536 and the circuit element 537 to fix the circuit element 537 and protect the circuit element 537 from the outside. The circuit element 537 may be perfectly blocked from the outside by the housing 534.

According to an embodiment, the optical filter 535 may be attached to at least a part of one surface of the housing 534 to block the biometric sensor 532 from the outside. For example, the optical filter 535 may be attached to the entire region of a top surface of the housing 534 by a second adhesive film 52 (e.g., a DAF) to cover an opening 539 of the housing 534.

Figure 6A:
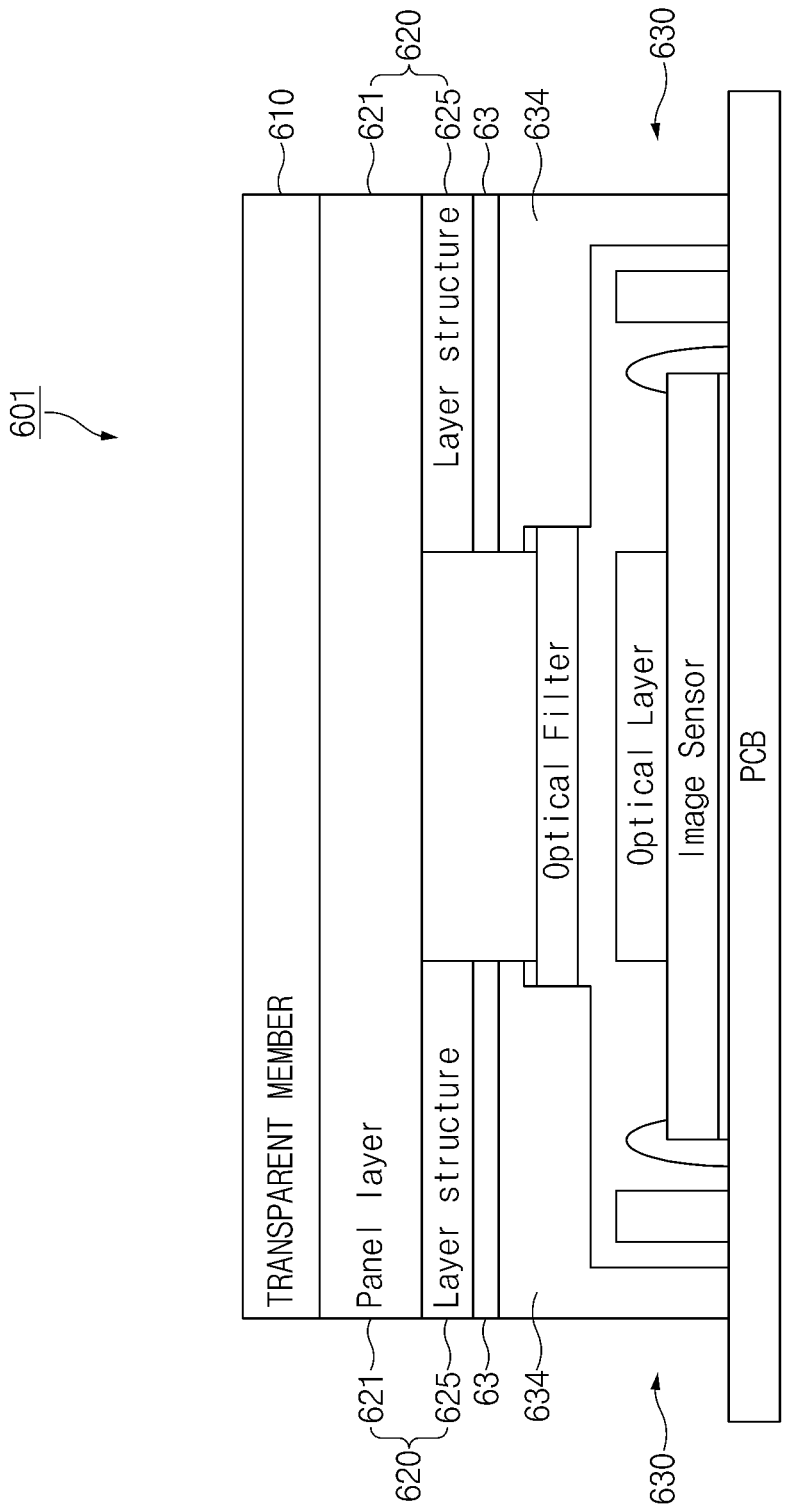
FIGS. 6A, 6B and 6C are cross-sectional views illustrating example electronic devices according to various embodiments.
Figure 6B:
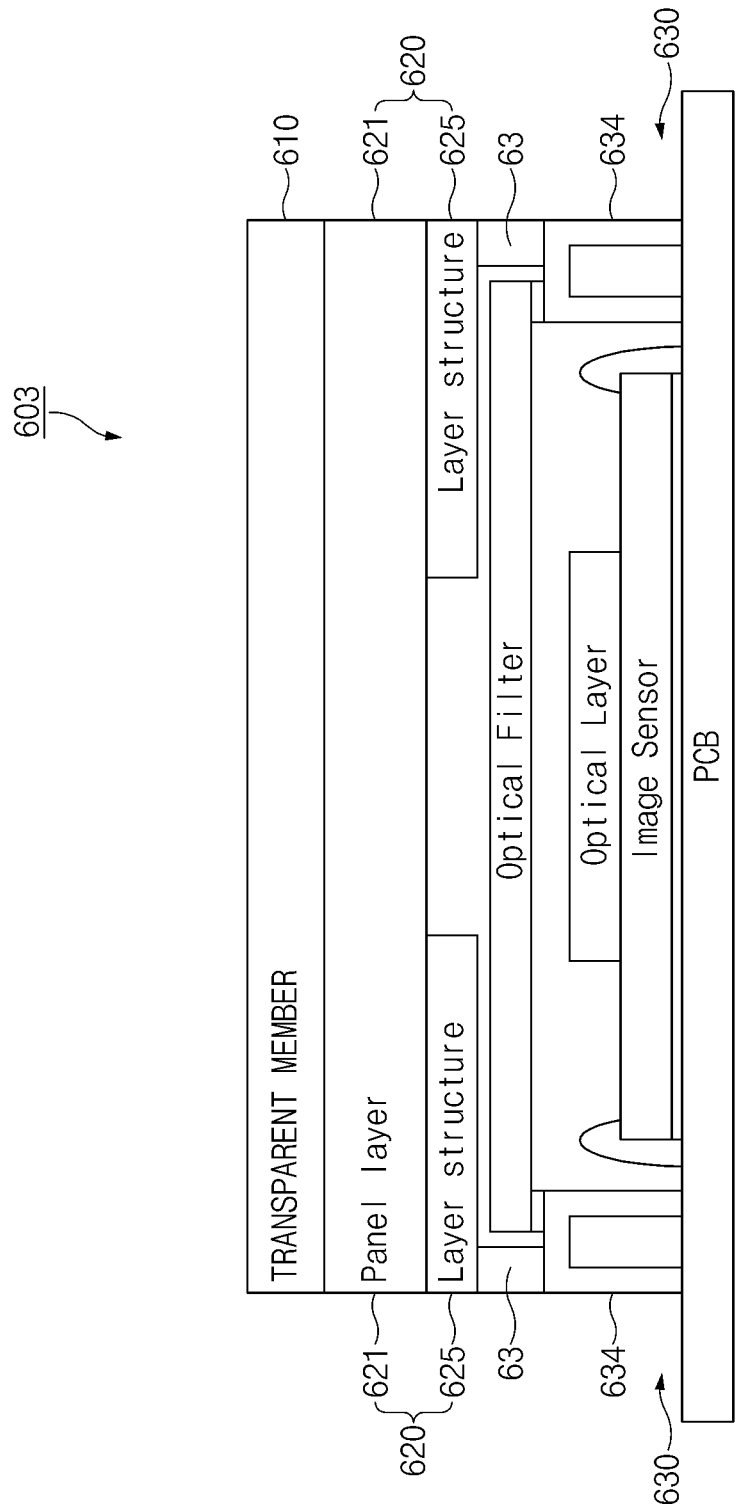
Figure 6C:
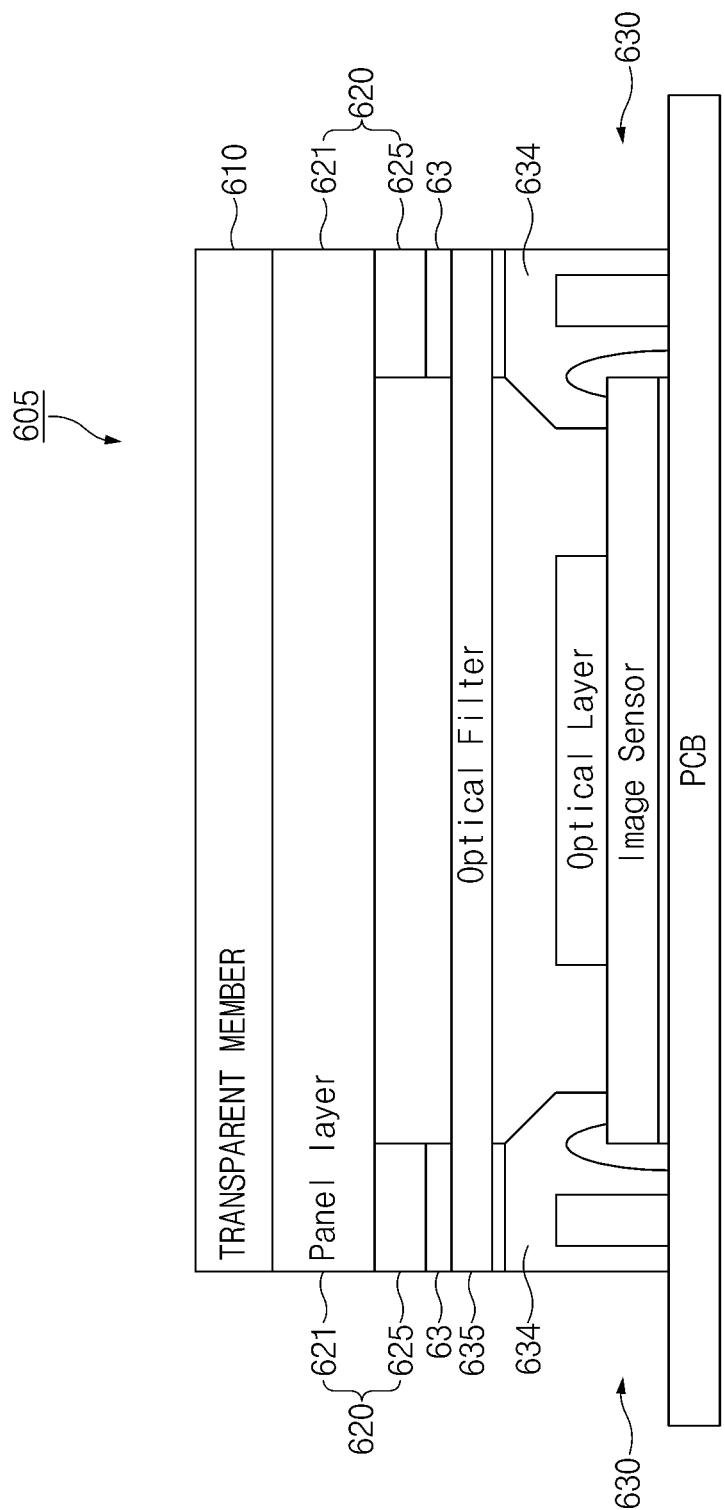

FIGS. 6A, 6B and 6C are cross-sectional views illustrating example electronic devices according to various embodiments.

The cross-section views shown in FIGS. 6A, 6B and 6C may correspond to cross-sectional views in a state where a biometric sensor module 630 is attached to a display (or display panel) 620. Referring to FIG. 6A, an electronic device 601 (e.g., an electronic device 301 of FIG. 3) may include a transparent member 610 (e.g., a transparent member 310 of FIG. 3), the display 620 (e.g., a display device 320 of FIG. 3), and a biometric sensor module 630.

According to an embodiment, the biometric sensor module 630 may be attached to the display 620 by a top surface of a housing 634. For example, the biometric sensor module 630 may be attached to one surface (e.g. a bottom surface) of a layer structure 625 by a third adhesive film 63 disposed between the housing 634 and the layer structure 625.

According to an embodiment, in a state where the biometric sensor module 630 is attached to the display 620, a biometric sensor module (e.g., an image sensor, an optical layer, and an optical filter) may face a panel layer 621. According to an embodiment, the third adhesive film 63 may have a specified thickness to ensure the performance of the biometric sensor module 630.

Referring to FIG. 6B, an electronic device 603 (e.g., an electronic device 301 of FIG. 3) may include a transparent member 610 (e.g., a transparent member 310 of FIG. 3), a display 620 (e.g., a display device 320 of FIG. 3), and a biometric sensor module 630.

According to an embodiment, the biometric sensor module 630 may be attached to the display 620 by a part (e.g., a second region) of a top surface of a housing 634. The part of the top surface of the housing 634 may be a region except for a region (e.g., a first region) to which an optical filter is attached in the top surface of the housing 634. For example, the biometric sensor module 630 may be attached to one surface (e.g. a bottom surface) of a layer structure 625 by a third adhesive film 63 disposed between a partial region of the housing 634 and the layer structure 625.

According to an embodiment, in a state where the biometric sensor module 630 is attached to the display 620, a biometric sensor module (e.g., an image sensor, an optical layer, and an optical filter) may face a panel layer 621. According to an embodiment, the third adhesive film 63 may have a specified thickness to ensure the performance of the biometric sensor module 630.

Referring to FIG. 6C, an electronic device 605 (e.g., an electronic device 301 of FIG. 3) may include a transparent member 610 (e.g., a transparent member 310 of FIG. 3), a display 620 (e.g., a display device 320 of FIG. 3), and a biometric sensor module 630.

According to an embodiment, the biometric sensor module 630 may be attached to the display 620 by an optical filter 635. For example, the biometric sensor module 630 may be attached to one surface (e.g. a bottom surface) of a layer structure 625 by a third adhesive film 63 disposed between a partial region of the optical filter 635 and the layer structure 625.

According to an embodiment, in a state where the biometric sensor module 630 is attached to the display 620, a biometric sensor module (e.g., an image sensor, an optical layer, and an optical filter) may face a panel layer 621. According to an embodiment, the third adhesive film 63 may have a specified thickness to ensure the performance of the biometric sensor module 630.

According to the situation, the expression "adapted to or configured to" used herein may be interchangeably used as, for example, the expression "suitable for", "having the capacity to", "changed to", "made to", "capable of" or "designed to" in hardware or software or any combination thereof. The expression "a device configured to" may refer, for example, to a situation in which the device is "capable of" operating together with another device or other parts. For example, a "processor configured to (or set to) perform A, B, and C" may refer, for example, and without limitation, to a dedicated processor (e.g., an embedded processor) for performing corresponding operations, a generic-purpose processor (e.g., a central processing unit (CPU), an application processor (AP)) which performs corresponding operations by executing one or more software programs which are stored in a memory device (e.g., the memory 830), or the like.

The term "module" used herein may include a unit, which is implemented with hardware, software, or firmware, or any combination thereof, and may be interchangeably used with the terms "logic", "logical block", "part", "circuit", or the like. The "module" may be a minimum unit of an integrated part or a part thereof or may be a minimum unit for performing one or more functions or a part thereof. The "module" may be implemented mechanically and/or electronically and may include, for example, and without limitation, an application-specific IC (ASIC) chip, a field-programmable gate array (FPGA), a programmable-logic device, or the like, for performing some operations, which are known or will be developed.

At least a part of an apparatus (e.g., modules or functions thereof) or a method (e.g., operations) according to various embodiments may be, for example, implemented by instructions stored in a computer-readable storage media (e.g., the memory 830) in the form of a program module. The instruction, when executed by a processor (e.g., the processor 820), may cause the processor to perform a function corresponding to the instruction. The computer-readable recording medium may include a hard disk, a floppy disk, a magnetic media (e.g., a magnetic tape), an optical media (e.g., a compact disc read only memory (CD-ROM) and a digital versatile disc (DVD), a magneto-optical media (e.g., a floptical disk)), an embedded memory, and the like. The one or more instructions may contain a code made by a compiler or a code executable by an interpreter.

Each component (e.g., a module or a program module) according to various embodiments may include a single entity or a plurality of entities, a part of the above-described sub-components may be omitted, or other sub-components may be further included. Alternatively or additionally, after being integrated in one entity, some components (e.g., a module or a program module) may identically or similarly perform the function executed by each corresponding component before integration. According to various embodiments, operations executed by modules, program modules, or other components may be executed by a successive method, a parallel method, a repeated method, or a heuristic method, or at least one part of operations may be executed in different sequences or omitted. Alternatively, other operations may be added.

While the present disclosure has been illustrated and described with reference to various example embodiments thereof, it will be understood by those skilled in the art that various changes in form and details may be made without departing from the spirit and scope of the present disclosure as defined, for example, by the appended claims and their equivalents.

What is claimed is:

1. An electronic device, comprising:
   a transparent layer;
   a display panel disposed under the transparent layer and including pixels;
   a sensor housing disposed under the transparent layer and under the display panel, the sensor housing including at least one side wall, and an upper wall in which an opening is formed;
   a biometric sensor mounted on a printed circuit board (PCB), wherein the sensor housing is mounted on the PCB such that the biometric sensor is disposed within the at least one side wall of the sensor housing when viewed from above; and
   an optical filter disposed at least partially within the at least one side wall of the sensor housing when viewed from above, the optical filter overlapping the opening defined in the upper wall of the sensor housing when viewed from above, and wherein the optical filter is disposed apart from both the biometric sensor and the display panel, wherein an air gap is formed between the optical filter and the biometric sensor;
   wherein the biometric sensor is configured to receive light reflected from an object to be positioned on the transparent layer and passing through each of: the display panel, the opening defined in the upper wall of the sensor housing, and the optical filter, and
   wherein, when viewed from above, the opening defined in the upper wall of the sensor housing has an area which is smaller than a top surface area of the biometric sensor.

2. The electronic device of claim 1, wherein the upper wall of the sensor housing includes a first portion partially facing a rear surface of the display panel and forming a first part of the opening, and a second portion surrounding the optical filter and forming a second part of the opening, and
   wherein the first part of the opening has a first size, and the second part of the opening has a second size which is greater than the first size and smaller than a size of the top surface of the biometric sensor.

3. The electronic device of claim 2, wherein when viewed in a direction perpendicular to the display panel, the optical filter has a cross-sectional area which is larger than the first part of the opening, and the optical filter is disposed in the second part of the opening to cover the first part of the opening.

4. The electronic device of claim 3, wherein when viewed in a direction perpendicular to the display panel, the optical filter has a cross-sectional area which is smaller than a cross sectional area of the top surface of the biometric sensor.

5. The electronic device of claim 4, wherein the biometric sensor is electrically connected to the PCB by wire bonding.

6. The electronic device of claim 5, further comprising a circuit element electrically connected to the biometric sensor.

7. The electronic device of claim 1, wherein the display panel includes a plurality of layers, and the plurality of layers includes a metal inclusive layer forming a rear surface of the display panel, and
   wherein a second opening is formed in the metal inclusive layer, and
   wherein the opening of the sensor housing is partially aligned with the second opening of the metal inclusive layer.

8. The electronic device of claim 7, further comprising a layer disposed between an area around the second opening of the metal inclusive layer and an area around the opening of the sensor housing, so that the sensor housing and the metal inclusive layer are spaced apart from each other.

9. The electronic device of claim 7, wherein the display panel includes a flat area and a bending area extending from a side of the flat area, and
   wherein the bending area may be electrically connected with a flexible printed circuit board under the display panel.

10. The electronic device of claim 7, further comprising a supporting member combined with the display device to physically support the display device.

11. The electronic device of claim 1, wherein the light received by the biometric sensor includes light emitted from the pixels and reflected from the object.

12. The electronic device of claim 11, wherein the optical filter is configured to transmit light of a visible band and block at least a portion of light of an infrared band.

13. An electronic device, comprising:
   a transparent layer;
   a display panel disposed under the transparent layer and including pixels;
   a sensor housing disposed under the display panel, the sensor housing including at least one side wall and an upper wall in which a first opening is formed;
   a metal inclusive layer disposed between at least the display panel and the upper wall of the sensor housing, wherein a second opening at least partially aligned with the first opening is formed in the metal inclusive layer;
   a biometric sensor mounted on a printed circuit board (PCB), wherein the sensor housing is mounted on the PCB such that the biometric sensor is disposed inside the sensor housing as viewed from above;
   an optical filter disposed inside the sensor housing as viewed from above and attached to a portion of the sensor housing corresponding to the first opening such that the optical filter is disposed apart from both the biometric sensor and the display panel, wherein an air gap is formed between the optical filter and the biometric sensor;

a circuit element mounted on the PCB and disposed inside the sensor housing as viewed from above, the circuit element electrically connected to the biometric sensor; and wherein the biometric sensor is configured to receive light emitted from the pixels and reflected from an object positioned on the transparent layer and passing through each of: the display panel, the second opening of the metal layer, the first opening of the sensor housing, and the optical filter, and wherein, when viewed from above, the first opening define in the upper wall of the sensor housing has a cross-sectional area which is smaller than a top surface area of the biometric sensor.

14. The electronic device of claim 13, wherein the upper wall of the sensor housing includes a first portion at least partially facing the metal layer, and a second portion formed under the first portion, and wherein the first portion forms a first part of the first opening having a first size, and the second portion forms a second part of the first opening having a second size greater than the first size, and wherein the optical filter is disposed in the second part of the first opening, and partially overlaps the first part of the first opening.

15. The electronic device of claim 14, wherein when viewed in a direction perpendicular to the display panel, the optical filter has a cross- sectional area which is larger than the first part of the first opening.

16. The electronic device of claim 14, wherein the biometric sensor is electrically connected to the PCB by wire bonding.

17. An electronic device, comprising:
a transparent layer;
a display panel disposed under the transparent layer and including pixels;
a sensor housing disposed under the display panel, the sensor housing including at least one side wall and an upper wall in which a first opening is formed;
a metal layer disposed between the display panel and the upper wall of the sensor housing, wherein a second opening is formed in the metal layer and the second opening is at least partially aligned with the first opening;
a biometric sensor mounted on a printed circuit board (PCB) and electrically connected to the PCB by wire bonding, wherein the sensor housing is mounted on the PCB such that the biometric sensor is disposed inside the sensor housing as viewed from above;
an optical filter disposed inside the sensor housing and attached to a portion of the sensor housing corresponding to at least the first opening such that the optical filter is disposed apart from the biometric sensor, wherein an air gap is formed between the optical filter and the biometric sensor;
a circuit element mounted on the PCB and disposed inside the sensor housing as viewed from above, the circuit element electrically connected to the biometric sensor;
a layer disposed between at least an area around the second opening of the metal layer and an area around the first opening of the sensor housing, the layer having a thickness such that the metal layer and the upper wall of the sensor housing are spaced apart; and wherein the biometric sensor is configured to receive light emitted from at least one of the pixels and reflected from an object positioned on the transparent layer to at least partially contact the transparent member and passing through each of: the display panel, the second opening of the metal layer, the first opening of the sensor housing, and the optical filter, and wherein, when viewed from above, the first opening in the upper wall of the sensor housing has a cross-sectional area which is smaller than a top surface area of the biometric sensor.

18. The electronic device of claim 17, wherein the upper wall of the sensor housing includes a first portion partially facing the metal layer and forming a first part of the first opening, and a second portion surrounding the optical filter and forming a second part of the opening, the first and second parts being stepped with respect to each other at the first opening; and wherein the first part of the opening has a first size and the second part of the opening has a second size which is greater than the first size.

19. The electronic device of claim 17, wherein the layer comprises an adhesive for attaching the upper wall of the housing and the metal layer.

20. An electronic device, comprising:
a transparent member;
a display panel disposed under the transparent member and including pixels;
a sensor housing disposed under the display panel, the sensor housing including at least one side wall and an upper wall in which an opening is formed;
a biometric sensor mounted on a printed circuit board (PCB), wherein the sensor housing is mounted on the PCB such that the biometric sensor is disposed inside the sensor housing; and
an optical filter disposed inside the sensor housing and attached to a portion of the sensor housing corresponding to the opening such that the optical filter is disposed apart from both the biometric sensor and the display panel, wherein an air gap is provided between the biometric sensor and the optical filter;
wherein the biometric sensor is configured to receive light reflected from an object positioned on the transparent member and passing through the display panel, the opening of the sensor housing and the optical filter, and
wherein, when viewed in a direction perpendicular to the display panel, the opening formed at the upper wall of the sensor housing has a cross-sectional area which is smaller than a top surface area of the biometric sensor.

21. The electronic device of claim 20, wherein the upper wall of the sensor housing includes a first portion partially facing a rear surface of the display panel and forming a first part of the opening, and a second portion surrounding the optical filter and forming a second part of the opening, and wherein the first part of the opening has a first size, and the second part of the opening has a second size which is greater than the first size and smaller than a size of the top surface of the biometric sensor.

22. The electronic device of claim 20, wherein when viewed in a direction perpendicular to the display panel, the optical filter has a cross- sectional area which is larger than the first part of the opening, and the optical filter is disposed in the second part of the opening.

23. The electronic device of claim 20, wherein when viewed in a direction perpendicular to the display panel, the optical filter has a cross- sectional area which is smaller than a cross sectional area of the top surface of the biometric sensor.

24. The electronic device of claim 20, wherein the biometric sensor is electrically connected to the PCB by wire bonding.

25. The electronic device of claim 20, wherein the display panel includes a metal inclusive layer at a rear surface of the display panel, and
    wherein a second opening is formed in the metal inclusive layer, and
    wherein the opening of the sensor housing is partially aligned with the second opening of the metal inclusive layer.

26. The electronic device of claim 25, further comprising a layer disposed between an area around the second opening of the metal inclusive layer and an area around the opening of the sensor housing, so that the sensor housing and the metal inclusive layer are spaced apart from each other.

27. The electronic device of claim 20, wherein the optical filter is configured to transmit light of at least one visible band and block at least a portion of light of an infrared band.

\* \* \* \* \*